(12) United States Patent
Michael

(10) Patent No.: US 9,971,647 B2
(45) Date of Patent: May 15, 2018

(54) APPARATUS AND METHOD FOR PROGRAMMING ECC-ENABLED NAND FLASH MEMORY

(71) Applicant: Winbond Electronics Corporation, Taichung (TW)

(72) Inventor: Oron Michael, San Jose, CA (US)

(73) Assignee: Winbond Electronics Corporation, Taichung (TW)

( * ) Notice: Subject to any disclaimer, the term of this patent is extended or adjusted under 35 U.S.C. 154(b) by 205 days.

(21) Appl. No.: 14/447,919

(22) Filed: Jul. 31, 2014

(65) Prior Publication Data
US 2016/0034351 A1    Feb. 4, 2016

(51) Int. Cl.
| G06F 11/00 | (2006.01) |
| G06F 11/10 | (2006.01) |
| G06F 12/08 | (2016.01) |
| G11C 29/04 | (2006.01) |

(52) U.S. Cl.
CPC ...... *G06F 11/1072* (2013.01); *G06F 11/1048* (2013.01); *G06F 11/1064* (2013.01); *G06F 12/08* (2013.01); *G11C 2029/0411* (2013.01)

(58) Field of Classification Search
CPC .......... G06F 11/1072; G06F 11/1068; G06F 7/5057; G11C 2216/20
USPC ................................................ 714/758, 763
See application file for complete search history.

(56) References Cited

U.S. PATENT DOCUMENTS

| 7,120,836 | B1 | 10/2006 | Englin et al. |
| 7,558,900 | B2 | 7/2009 | Jigour et al. |
| 8,533,572 | B2 | 9/2013 | Lu et al. |
| 8,667,368 | B2 | 3/2014 | Gupta et al. |
| 2003/0163629 | A1* | 8/2003 | Conley .................. G11C 16/10 711/103 |

(Continued)

FOREIGN PATENT DOCUMENTS

| TW | 201419295 | 5/2014 |
| TW | 201435893 | 9/2014 |

OTHER PUBLICATIONS

Winbond Electronics Corporation. W25N01GV spiflash 3V 1G-Bit Serial SLC Nand Flash Memory with Dual/Quad SPI & Continuous Read, Preliminary Revision B, Nov. 26, 2013. 69 Pages.

*Primary Examiner* — Albert Decady
*Assistant Examiner* — Osman M Alshack
(74) *Attorney, Agent, or Firm* — Finnegan, Henderson, Farabow, Garrett & Dunner LLP

(57) ABSTRACT

The NAND flash memory array in a memory device may be programmed using a cache program execute technique for fast performance. The memory device includes a page buffer, which may be implemented as a cache register and a data register. Program data may be loaded to the cache register, where it may be processed by an error correction code ("ECC") circuit. Thereafter, the ECC processed data in the cache register may be replicated to the data register and used to program the NAND flash memory array. Advantageously, immediately after the ECC processed data in the cache register is replicated to the data register, the cache register may be made available for other operations. Of particular benefit is that a second page of program data may be loaded into the cache register and ECC processed while the first page of program data is being programmed into the NAND flash memory array.

11 Claims, 6 Drawing Sheets

(56) References Cited

U.S. PATENT DOCUMENTS

| | | | |
|---|---|---|---|
| 2006/0221714 A1* | 10/2006 | Li | G11C 11/5642 365/185.2 |
| 2008/0159002 A1* | 7/2008 | Dong | G11C 11/5628 365/185.25 |
| 2009/0024904 A1* | 1/2009 | Roohparvar | G06F 11/1068 714/773 |
| 2009/0080265 A1* | 3/2009 | Mokhlesi | G11C 7/12 365/185.23 |
| 2009/0210772 A1* | 8/2009 | Noguchi | G06F 11/1068 714/764 |
| 2010/0058003 A1* | 3/2010 | Goto | G11C 7/10 711/154 |
| 2010/0061151 A1* | 3/2010 | Miwa | G11C 11/5628 365/185.17 |
| 2010/0103734 A1* | 4/2010 | Hemink | G11C 11/5628 365/185.03 |
| 2013/0111287 A1* | 5/2013 | Chao | G06F 11/0745 714/746 |
| 2013/0346671 A1 | 12/2013 | Michael et al. | |
| 2014/0215128 A1* | 7/2014 | Chin | G11C 11/5628 711/103 |
| 2014/0258811 A1* | 9/2014 | Liu | G06F 11/1044 714/766 |
| 2014/0269065 A1 | 9/2014 | Jigour et al. | |
| 2014/0269071 A1* | 9/2014 | Pandya | G11C 16/10 365/185.11 |

\* cited by examiner

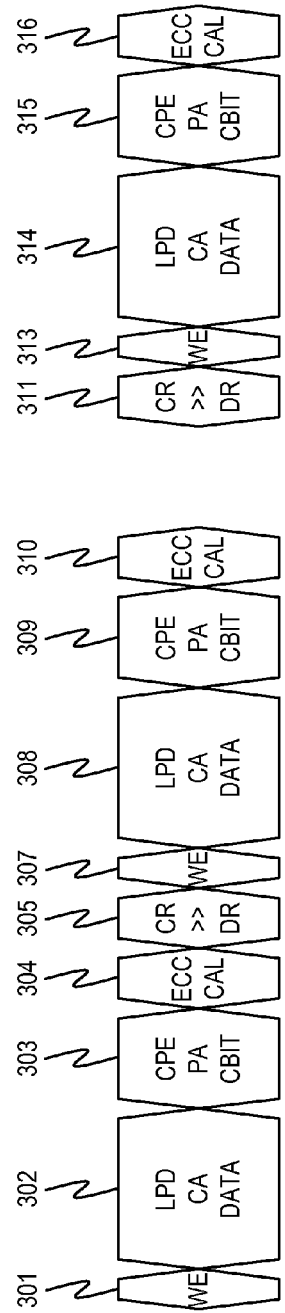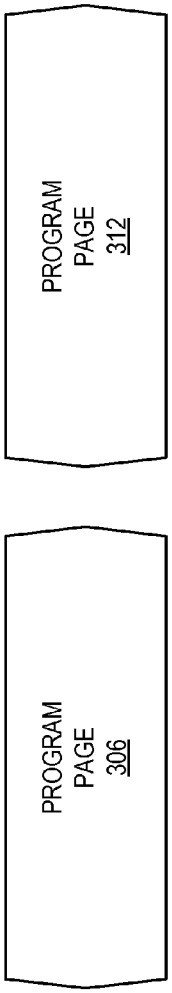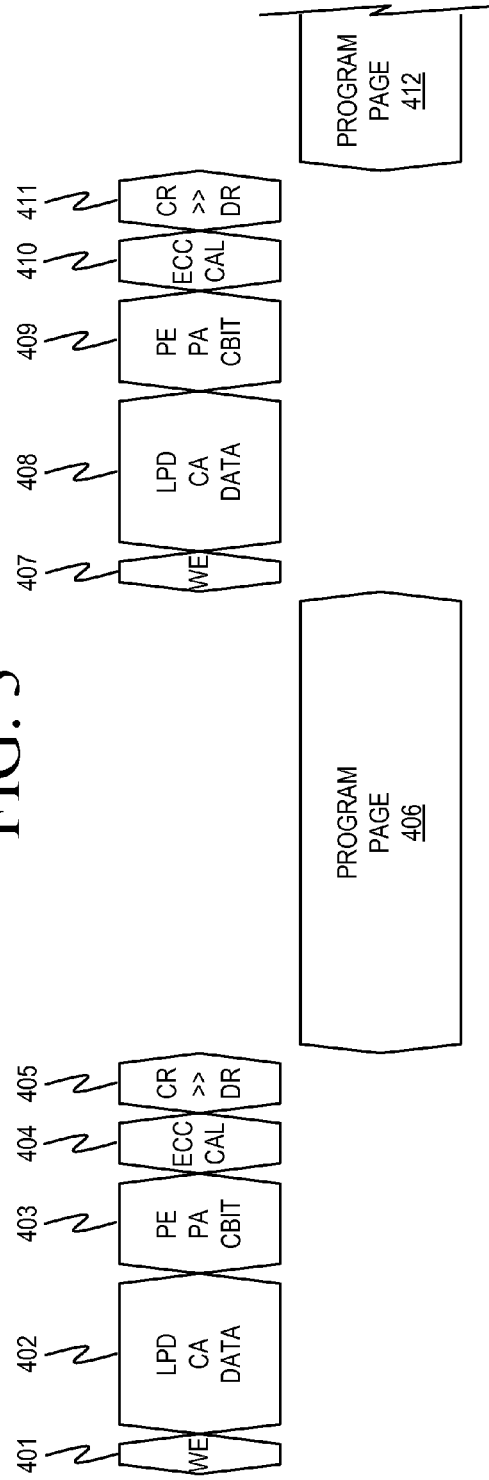
FIG. 3
FIG. 4

APPARATUS AND METHOD FOR PROGRAMMING ECC-ENABLED NAND FLASH MEMORY

BACKGROUND OF THE INVENTION

Field of the Invention

The present invention relates to digital memory devices, and more particularly to apparatus and methods for programming ECC-enabled NAND flash memory.

Description of Related Art

NAND flash memory has become increasingly popular due to its significant cost advantage. Moreover, NAND flash memory is now available in a variety of different interfaces, ranging from traditional NAND interfaces to low pin count Serial Peripheral Interfaces ("SPI"). However, NAND flash memory is susceptible to bad block conditions and occasional read errors, so that bad block management and error correction code processing is commonly used with such memory.

One implementation of ECC and bad block management during a program operation is disclosed in a publication by Winbond Electronics Corporation, W25N01 GV: SpiFlash 3V 1 G-Bit Serial SLC NAND Flash Memory with Dual/Quad SPI & Continuous Read: Preliminary Revision B, Hsinchu, Taiwan, R.O.C., Nov. 26, 2013. The Program operation allows from one byte to 2,112 bytes (a page) of data to be programmed at previously erased (FFh) memory locations. A program operation, which is preceded by a Write Enable instruction, involves two steps: (1) load the program data into the Data Buffer; and (2) transfer the data from the Data Buffer to a specified memory page.

An example of an instruction which loads the program data into the Data Buffer is the "Load Program Data" instruction, which is initiated by driving the /CS pin low, and then shifting in the instruction code "02h" followed by a 16-bit column address and 8-bit dummy clocks, and at least one byte of data.

An example of an instruction which transfers the data from the Data Buffer to the specified memory page is the "Program Execute" instruction, which is initiated by driving the /CS pin low, and then shifting in the instruction code "10h" followed by 8-bit dummy clocks and the 16-bit Page Address. After /CS is driven high to complete the instruction cycle, the self-timed Program Execute instruction commences for a time duration of tPP, which is the time needed for such time-intensive tasks as page program, One-Time Program ("OTP") Lock, and Bad Block Management ("BBM"). The time tPP is typically about 250 μs, but may be as long as 700 μs. While the Program Execute cycle is in progress, the Read Status Register instruction may be used for checking the status of the Busy bit, which is a logical 1 during the Program Execute cycle and becomes a logical 0 when the cycle completes and the device is ready to accept instructions. When the Program Execute cycle completes, the Write Enable Latch (WEL) bit in the Status Register is cleared to 0.

If internal ECC is enabled, all bytes of data on the page and in the extra 64 byte section (spare area) are accepted, but the bytes designated for the error correction code in the extra 64 byte section are overwritten by the ECC calculation.

If another page is to be programmed, another program operation may be carried out by issuing another Write Enable instruction, followed by another "Load Program Data" instruction, followed by another "Program Execute" instruction.

BRIEF SUMMARY OF THE INVENTION

One embodiment of the present invention is a method of programming a NAND flash memory array of a memory device with a page of program data from a data bus using a data register and a cache register of the memory device configured as a page buffer for the NAND flash memory array, comprising storing in the cache register a first page of program data from the data bus; performing an error correction code ("ECC") operation on the first page of program data stored in the cache register to establish a first page of ECC processed data in the cache register; storing in the data register the first page of ECC processed data from the cache register; programming the NAND flash memory array with the first page of ECC processed data from the data register; storing in the cache register a second page of program data from the data bus, in an overlapping time relationship with the first page programming step; and performing an error correction code ("ECC") operation on the second page of program data stored in the cache register to establish a second page of ECC processed data in the cache register, in an overlapping time relationship with the first page programming step.

Another embodiment of the present invention is a memory device comprising a NAND flash memory array; a row decoder coupled to the NAND flash memory array; a data register coupled to the NAND flash memory array; a cache register coupled to the data register; an ECC circuit coupled to the cache register; a column decoder coupled to the cache register; and a control circuit coupled to the row decoder, the column decoder, the data register, the cache register, and the ECC circuit. The control circuit comprises logic and register elements for executing the functions of: storing in the cache register a first page of program data; performing an error correction code ("ECC") operation on the first page of program data stored in the cache register with the ECC circuit, to establish a first page of ECC processed data in the cache register; storing in the data register the first page of ECC processed data from the cache register; programming the NAND flash memory array with the first page of ECC processed data from the data register; storing in the cache register a second page of program data, in an overlapping time relationship with the programming of the NAND memory; and performing an error correction code ("ECC") operation on the second page of program data stored in the cache register to establish a second page of ECC processed data in the cache register, in an overlapping time relationship with the programming of the NAND flash memory array.

BRIEF DESCRIPTION OF THE SEVERAL VIEWS OF THE DRAWINGS

FIG. 3 is a timing diagram of a program operation using the cache program execute technique.

FIG. 4 is a timing diagram of a program operation using the program execute technique.

DETAILED DESCRIPTION OF THE INVENTION

Figure 1:
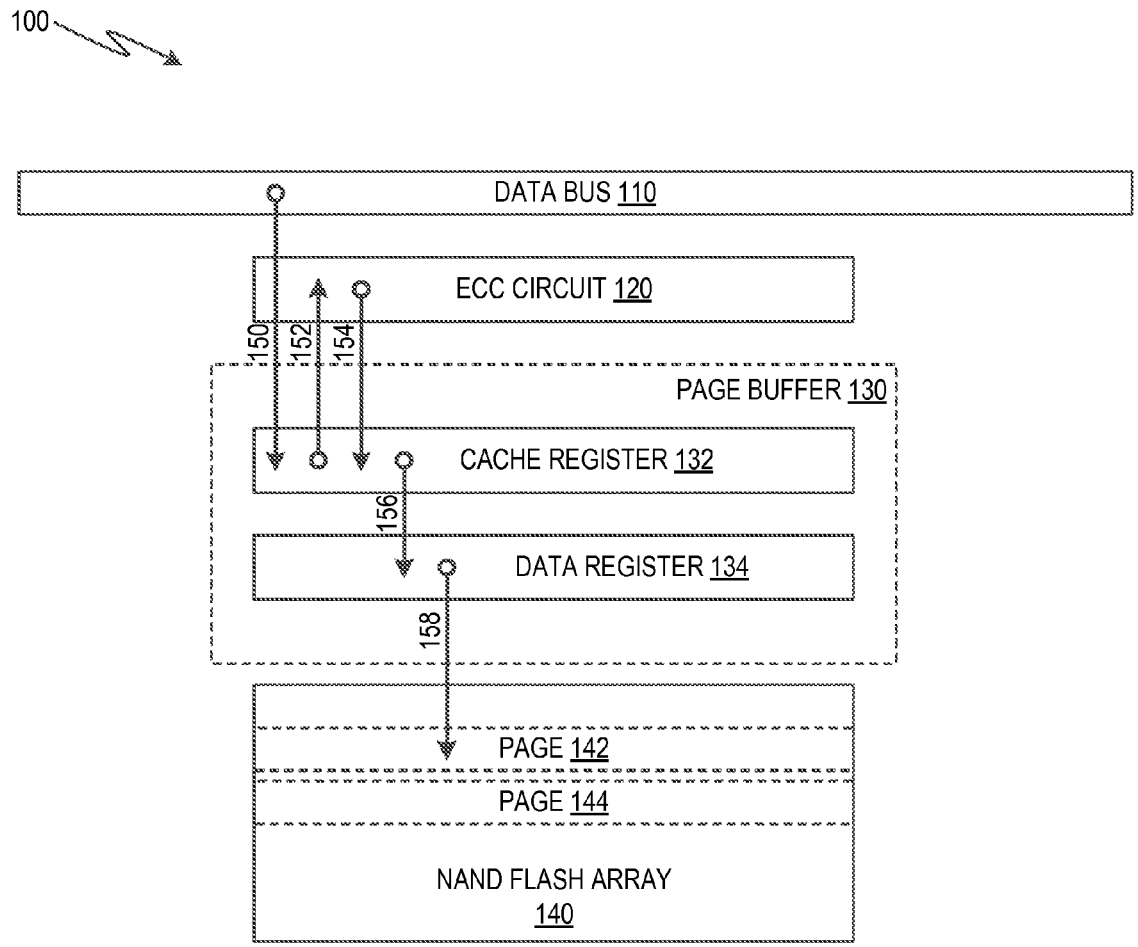
FIG. 1 is a schematic block diagram of a NAND flash memory device.

Fast read and program performance are desirable for NAND flash memory devices. Fast program performance may be achieved using a cache program execute technique such as shown in simplified form for clarity in FIG. 1. A NAND memory device 100 illustratively includes a NAND flash memory array 140, a page buffer 130, and an ECC circuit 120. BBM circuits may also be included but are omitted from FIG. 1 for clarity. The NAND flash memory array 140 has a number of pages for digital storage (illustrative pages 142 and 144 are shown), and the page buffer 130 has two very fast registers, a cache register 132 and a data register 134. To achieve fast programming, initially data on the data bus 110 may be loaded to the cache register 132 (arrow 150). Thereafter, data from the cache register 132 may be replicated to the ECC circuit 120 (arrow 152) as required by the particular ECC algorithm implemented by the ECC circuit 120 so that the error correction code may be calculated. The error correction code is written to the cache register (arrow 154), and in particular, to the spare area of the data page stored in the cache register 132. Thereafter, the ECC processed data in the cache register 132 may be replicated to the data register 134 (arrow 156). Thereafter, the NAND flash memory array 140 (illustratively the page 142) may be programmed with the ECC processed data in the data register 134 (arrow 158) using any suitable LUT technique for bad block management.

Advantageously, immediately after the ECC processed data in the cache register 132 is replicated to the data register 134 (arrow 156), the cache register 132 may be made available for other operations. Of particular benefit is that a second page of program data may be loaded into the NAND memory device 100 and ECC processed (arrows 150, 152 and 154) while the first page of program data is being programmed into the NAND flash memory array 140 (arrow 158).

Figure 2A:
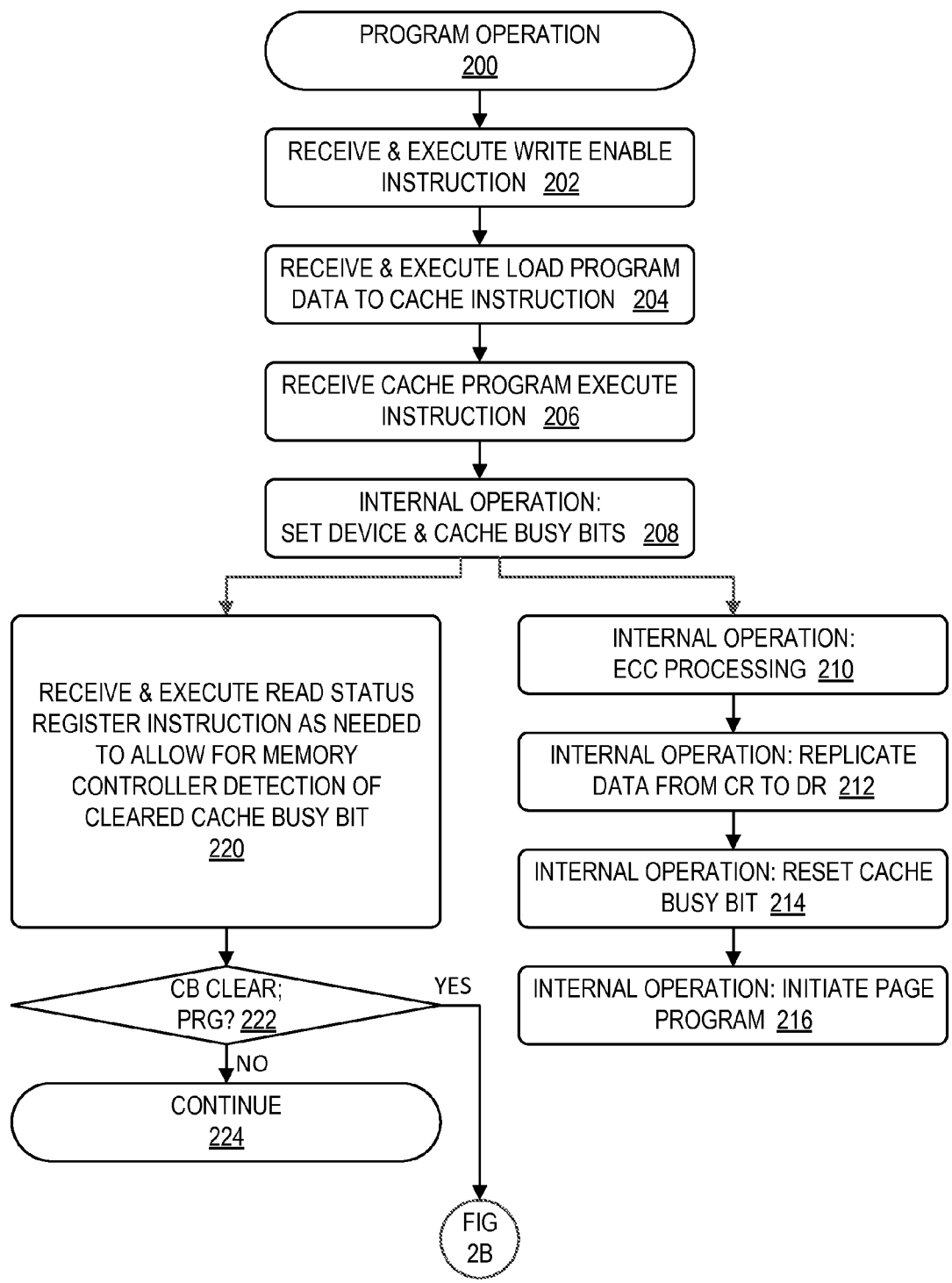
FIGS. 2A and 2B are respective sections of a flowchart of a program operation.
Figure 2B:
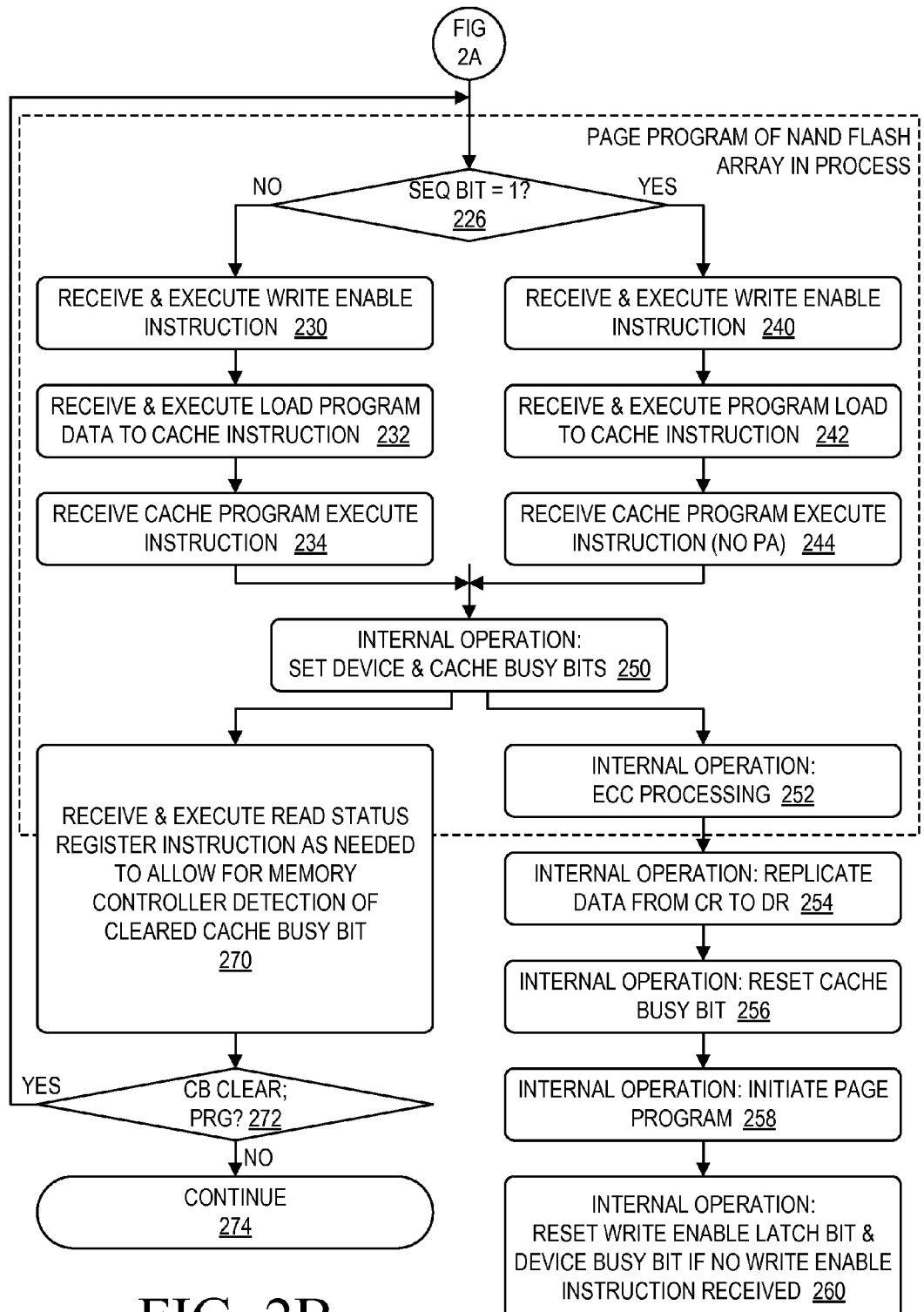

FIG. 2A and FIG. 2B are respective parts of a flowchart showing one example of a program operation 200 for carrying out the technique illustrated in FIG. 1. A Write Enable instruction is received and executed (block 202), and then a Load Program Data instruction is received and executed (block 204) to place program data into the cache register 132 (FIG. 1). The amount of time needed to complete the Load Program Data instruction is variable and depends on various factors such as the Serial Peripheral Interface {"SPI") protocol used (single, dual or quad bit, for example) and the operating frequency, but is taken into account by the controller which may issue a Cache Program Execute instruction in due course. The Cache Program Execute instruction is received by the NAND memory device 100 (block 206), which carries out various internal operations and is responsive to a limited number of instructions. Illustratively, the NAND memory device 100 may set a Device Busy Bit and a Cache Busy Bit (block 208), carry out ECC processing (block 210), replicate data from the cache register 132 to the data register 134 (block 212), reset the Cache Busy Bit (block 214), and initiate programming of a page of the NAND flash memory array 140 from the cache register 132 (block 216).

After the Cache Busy Bit is set (block 208), the NAND memory device 100 may respond to a Read Status Register instruction (block 220) so that the memory controller (not shown) may detect whether the Cache Busy Bit is cleared (block 214). If the Cache Busy bit is cleared (reset) and more programming of the NAND flash memory array is desired (block 222—yes), program operation may proceed with the various operations shown in FIG. 2B. If no further programming of the NAND flash memory array is desired (block 272—no), other operations may be carried out after the Busy Bit is cleared (block 224).

While page programming is in progress, the NAND memory device 100 may perform a number of other operations in parallel with page programming to improve the overall throughput of the program operation. The NAND memory device 100 may be enabled to be responsive during page programming to the Write Enable instruction, the Load Program Data instruction, and the Cache Program Execute instruction in the following manner, even while the Device Busy Bit is set.

As shown in FIG. 2B, a Sequence Bit is checked (block 226) to determine whether the program operation is for a particular page or for a sequential program operation. In the former event (block 226—no), a Write Enable instruction is received and executed (block 230), a Load Program Data instruction is received and executed (block 232) to place program data into the cache register 132 (FIG. 1), and a Cache Program Execute instruction is received by the NAND memory device 100 (block 234). In the later event (block 226—yes), a Write Enable instruction is received and executed (block 240), a Load Program Data instruction is received and executed (block 242) to place program data into the cache register 132 (FIG. 1), and a second Cache Program Execute instruction is received by the NAND memory device 100 (block 244). The second Cache Program Execute need not specify a page address, since the page address is determined internally when doing sequential programming. Advantageously, the NAND memory device 100 may carry out various internal operations in response to the second Cache Program Execute instruction, even as the programming is in progress in response to the first Cache Program Execute instruction; illustratively, the NAND memory device 100 may set a Device Busy Bit and a Cache Busy Bit (block 250), and carry out ECC processing (block 252).

Whether or not page programming of the NAND flash memory array is in process, the NAND memory device 100 may respond to a Read Status Register instruction (block 270) so that the memory controller (not shown) may detect whether the Cache Busy Bit is cleared (reset). When page programming of the NAND flash memory array is completed, at that time various other internal operations may proceed; illustratively, replicating data from the cache register 132 to the data register 134 (block 254), resetting the Cache Busy Bit (block 256), initiating programming of a further page of the NAND flash memory array 140 from the cache register 132 (block 258), and resetting the write enable latch bit and the device busy bit if no Write Enable instruction is received (block 260). If the Cache Busy Bit is cleared and more programming of the NAND flash memory array is desired (block 272—yes), the various operations beginning with block 226 may be repeated. If no further programming of the NAND flash memory array is desired (block 272—no), other operations may be carried out after the Busy Bit is cleared (block 274).

The throughput advantage of the program operation 200 using the Cache Program Execute technique relative to the standard Program Execute technique may be appreciated by comparing the timing diagram of FIG. 3 for the former to the timing diagram of FIG. 4 for the latter. The timing sequence 301-305 (FIG. 3) and the timing sequence 401-405 (FIG. 4) are not substantially different. However, for the standard Program Execute technique, the timing sequence 407-410 is delayed pending completion of page programming 406. In contrast, and advantageously, the timing sequence 307-310 for the Cache Program Execute technique occurs while page programming 306 is occurring, so that the time used by these operations is masked by the time used by page programming 306. The benefit in throughput for multiple page programming events is evident, in that for the Cache Program Execute technique, program page 312 is delayed from program page 306 by only the time needed to transfer program data from the cache register 132 to the data register 134 (timing 311), whereas for the standard Program Execute technique, program page 412 is delayed from program page 406 not only by the time needed to transfer program data from the cache register 132 to the data register 134 (timing 411), but also by the timings 407-410 for respectively the Write Enable instruction, the Load Program Data instruction, the Program Execute instruction, and the ECC calculation.

Figure 5:
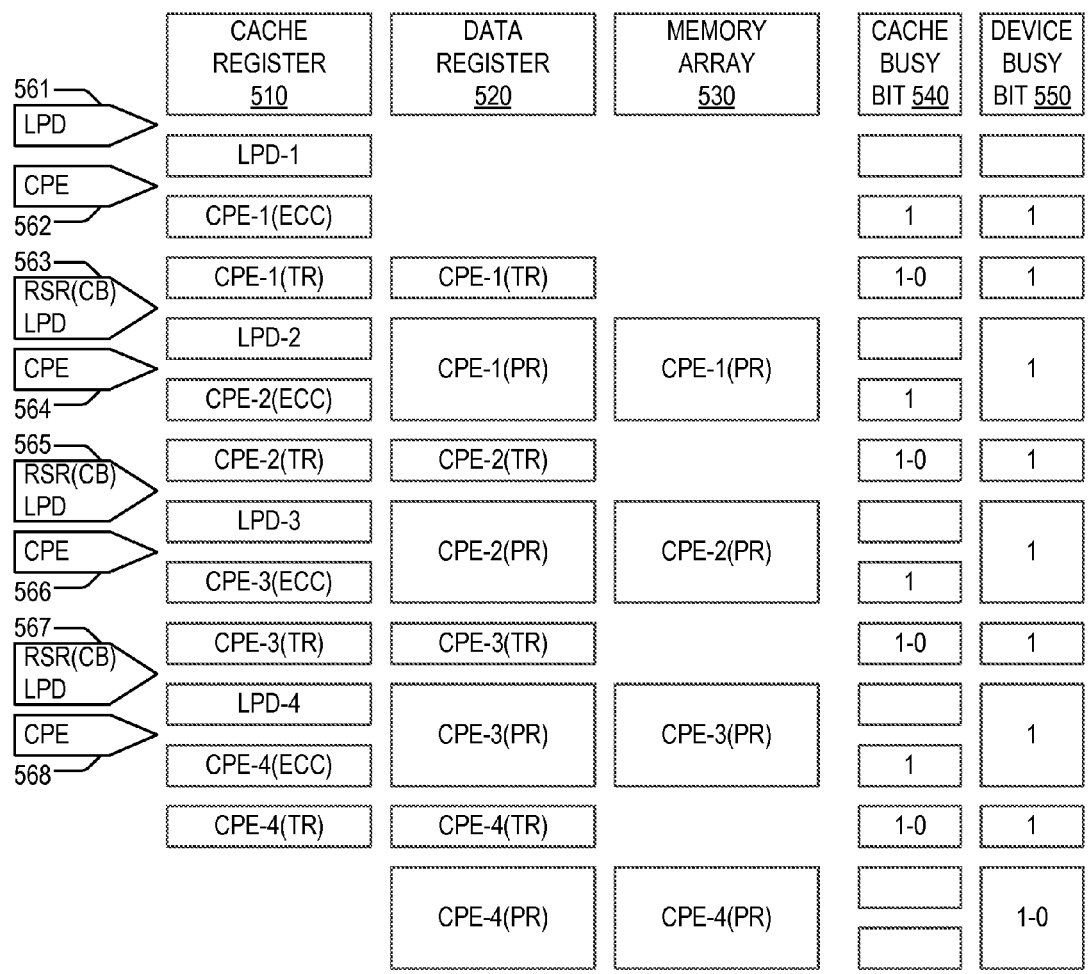
FIG. 5 is a schematic diagram showing utilization of certain resources of a NAND memory device during program operation using the cache program execute technique.

The reason for the performance improvement is the substantially full utilization of the resources of the NAND memory device 100 during most of the program operation. As shown in FIG. 5, the data register 520 and the NAND flash memory array 530 are not initially utilized by the first Load Program Data instruction 561 and the first Cache Program Execute instruction 562. However, after the Cache Busy Bit is cleared and in response to the second Load Program Data instruction 563 and the second Cache Program Execute instruction 564, the cache register 510 is utilized for receiving the program data (LPD-2) and then for ECC processing (CPE-2(ECC)), in an overlapping time relationship with use of the data register 520 and the NAND flash memory array 530 for page programming (CPE-1 (PR)). This substantially full utilization continues for subsequent Load Program Data and Cache Program Execute instruction sequences, whether sequential or with a specified page.

Figure 6:
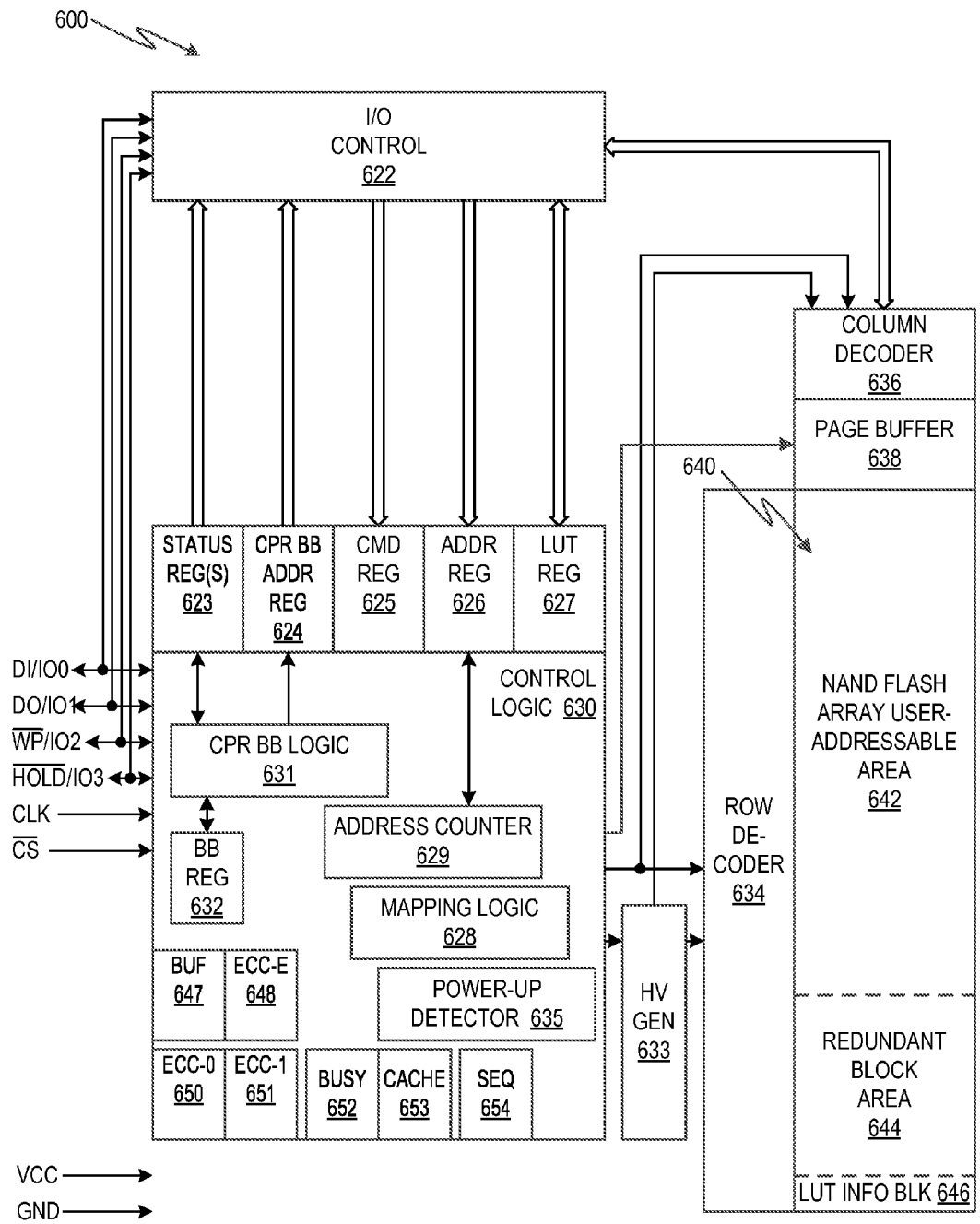
FIG. 6 is a schematic functional block diagram of a serial NAND flash memory.

The cache program execute technique may be used with various other techniques to realize NAND memory devices with both fast read and fast program capabilities, including fast continuous read. FIG. 6 is a schematic functional block diagram of an illustrative serial NAND flash memory 600 which is capable of providing a continuous read across page boundaries and from logically contiguous memory locations without wait intervals. Error Correction Code ("ECC") processing and Bad Block Management ("BBM") using a bad block Look-Up Table ("LUT") may be implemented "on chip" in the memory device itself, that is on the same die in an additional circuit, or even within the command and control logic of the memory device and tightly integrate with other functions of the command and control logic to enable a fast and efficient continuous read operation along with fast program operation using the cache program execute technique. Suitable NAND flash memory architectures are described in detail in, for example, U.S. Pat. No. 8,667,368 issued Mar. 4, 2014 to Gupta et al. and entitled "Method and Apparatus for Reading NAND Flash Memory," U.S. Patent Application Publication No. 2013/0346671 published Dec. 26, 2013 in the name of Michael et al. and entitled "On-Chip Bad Block Management for NAND Flash Memory," and U.S. patent application Ser. No. 13/799,215 filed Mar. 13, 2013 in the name of Jigour et al. and entitled "NAND Flash Memory," all of which hereby are incorporated herein in their entirety by reference thereto.

The serial NAND flash memory 600 includes a NAND flash memory array 640 and associated page buffer 638. The NAND flash memory array 640 includes word (row) lines and bit (column) lines, and is organized into a user-addressable area 642, a redundant block area 644, and a LUT information block 646. Any desired flash memory cell technology may be used for the flash memory cells of the NAND flash memory array 640. The serial NAND flash memory 600 may include various other circuits to support memory programming, erase and read, such as row decoder 634, column decoder 636, I/O control 622, status register(s) 623, continuous page read ("CPR") address register(s) 624, command register 625, address register 626, a LUT register 627, control logic 630, CPR bad block logic 631, a CPR bad block register 632, and high voltage generators 633. The row decoder 634 selects rows of the user-addressable area 642 under user control as well as, in some implementations, under internal control; and selects rows of the redundant block area 644 and LUT information block 646 under internal control. Power is supplied (not shown) throughout the circuits of the serial NAND flash memory 600 by power lines VCC and GND. While the NAND flash memory 600 may be packaged in any desired manner and may have any type of interface, including ordinary NAND flash memory interfaces, the control logic 630 of FIG. 6 illustratively implements the SPI/QPI protocol, including the multi-IO SPI interface. Additional detail on the SPI/QPI interface and on the various circuits of the memory may be found in U.S. Pat. No. 7,558,900 issued Jul. 7, 2009 to Jigour et al. and entitled "Serial Flash Semiconductor Memory," and in the aforementioned data sheet by Winbond Electronics Corporation, W25N01 GV SpiFlash 3V 1 G-Bit Serial SLC NAND Flash Memory with Dual/Quad SPI & Continuous Read, Preliminary Revision B, Hsinchu, Taiwan, R.O.C., Nov. 26, 2013, which hereby are incorporated herein in their entirety by reference thereto.

If mode switching is desired, a buffer mode flag BUF 647 may be provided. The buffer mode flag 647 may be provided as a bit of the status register(s) 623. A power-up detector 635 is provided in the control logic 630 to initiate the setting of a particular mode and the loading of a default page upon power-up.

BUSY 652 is a read only Device Busy bit that is set to a 1 state when the device is powering up or executing various instructions, including the Page Data Read instruction and the Continuous Read instruction. During this time the device ignores further instructions except for specific instructions such as the Read Status Register, the Read JEDEC ID instructions, and for purposes of the cache program execute technique, the Load Program Data instruction. When the executing instruction completes, the Busy Bit 652 is cleared to a 0 state, indicating the device is ready for further instructions. The Busy Bit 652 bit may be provided as part of the status register(s) 623.

CACHE 653 is a read only Cache Busy Bit that is set to a 1 state when the cache register in the page buffer 638 is being used during execution of a Load Program Data instruction or a Cache Program Execute instruction. When the cache register in the page buffer 638 is no longer busy, the Cache Busy Bit 653 is cleared to a 0 state, indicating that the cache register is ready for further instructions. The Cache Busy Bit 653 bit may be provided as part of the status register(s) 623.

The page buffer 638 illustratively includes a one-page data register (not shown), a one-page cache register (not shown), and one page of gates (not shown) for replicating data from the data register to the cache register. Any suitable latch or memory technology may be used for the data register and the cache register, and any suitable gating technology may be used for replicating data from the data register to the cache register. The data register and the cache register may be organized in any desired number of respective portions by, for example, the manner in which the gates are wired and operated to control replication of data. Illustratively, the data register and the cache register may be organized in two respective portions each, respectively DR-0 and DR-1, and CR-0 and CR-1, and operated in alternation by using respective groups of gates controlled by respective control lines. The data register and the cache register of the page buffer 638 may be operated in a conventional manner that is quite suitable for the cache program execute technique by applying the same control signal to respective gate control lines, and may be operated in alternation for such techniques a continuous read by applying suitable timed control signals to the gate control lines. Illustratively in a two portion implementation in which a page is 2K Bytes, a half-page (1K) of gates may be controlled by one control line and the other half-page (1K) of gates may be controlled by another control line, thereby organizing the data register and the cache register in two half-page (1K) portions which may be operated as such or as a single page (2K). Because of the operation of two portions in alternation, a two-portion implementation of the page buffer 638 may be referred to as a "ping pong" buffer. An ECC circuit (not show) may be provided to perform ECC computations on the contents of the cache register depending on the status of an ECC-E flag 648. ECC status bits ECC-0 650 and ECC-1 651 are provided to indicate the status of the ECC processing, and may be checked after the completion of a Read operation to verify the data integrity. The ECC-E 648, ECC-0 650 and ECC-1 651 bits may be provided as part of the status register(s) 623 if desired.

A different size of page buffer may be used and/or a division of the page buffer into more than two portions or into unequal portions may be done if desired, without affecting the usefulness of the cache program execute technique. Furthermore, differences between the logical and physical NAND flash memory array does not affect teachings herein. For example, the physical array may have two pages (even 2 KB page and odd 2 KB page) on one word line, so that a word line may be 4 KB of NAND bit cells. For clarity, the description and drawings herein are based upon the logical NAND flash memory array. The error correction circuit logically may be thought of as having a section ECC-0 which provides error correction of the contents of one half of the cache register (portion CR-0), and a section ECC-1 which provides error correction of the contents of the other half of the cache register (portion CR-1). Various ECC algorithms are suitable for use, including, for example, Hamming ECC algorithm, BCH ECC algorithm, Reed-Solomon ECC algorithm, and others. While two logical ECC sections ECC-0 and ECC-1 are shown as respectively interfacing with CR-0 and CR-1 for clarity of explanation, either two physical ECC blocks or a single physical ECC block may be used to interface with both CR-0 and CR-1. This manner of organizing the data register and cache register into portions and performing ECC on the portions is illustrative, and other techniques may be used if desired.

While the NAND flash memory 600 is organized and operated to perform a variety of read operations including continuous page read operations and on-chip ECC in a single-plane NAND Architecture, this architecture is illustrative and variations thereof are contemplated. It will be appreciated that the example of a 2 KB Page size and a specific block size are illustrative and may be different if desired. Moreover, the specific size reference is not to be taken literally, since the actual page size may vary depending on design factors; for example, the term may include a 2,048 Byte main area plus an additional 64 Byte spare area, where the spare area is used for storing an error correction code and other information such as meta data. In the same way, the term 1 KB may refer to a 1,024 Byte main area and a 32 Byte spare area. While the description herein is based upon a single-plane architecture for clarity, the teachings set forth herein are equally applicable to multi-plane architectures. When multiple physical planes are used, they may share one or more word-lines so that the memory system may service multiple I/O requests simultaneously. Each plane provides a page of data and includes a corresponding data register of one page size and a corresponding cache register of one page size. The techniques described herein may be applied to each plane separately such that each data register and cache register is organized in multiple portions, or may be applied to multiple planes such that each data register and cache register is itself one portion of a multiple page data register and cache register.

FIG. 6 also shows control signals /CS, CLK, DI, DO, /WP and /HOLD which are for the SPI interface. The standard SPI flash interface provides /CS (chip select—complement), CLK (clock), DI (serial data-in), and DO (serial data-out) signals, along with optional signals /WP (write protect—complement) and /HOLD (hold—complement). While the 1-bit serial data bus (data-in through DI and data-out through DO) in the standard SPI interface provides a simple interface and compatibility with many controllers which boot up in single SPI mode, it is limited in achieving higher read thru-put. A multi-bit SPI interface therefore evolved to additionally support dual (2-bit interface) and/or quad (4-bit interface) for increased read thru-put. FIG. 6 also shows additional data bus signals for Dual SPI and Quad SPI operation, i.e. I/O(0), I/O(1), I/O(2), and I/O(3), by selectively redefining the function of four pins. In one illustrative version of the Quad SPI read operation (other versions may be envisioned), the appropriate read instruction may be given with 1-bit standard SPI interface through I/O(0), but subsequent interface for address and data-out may be Quad based (i.e. 4-bit data bus). The Quad SPI read operation can output 4-bits of data in a clock cycle as compared to output 1-bit of data in standard SPI read operation, and therefore the Quad SPI read operation can provide four times higher read thru-put. While Quad SPI read operation is used herein for explanation, the teachings herein are equally applicable to the other modes of operation, including but not limited to single SPI, dual SPI, Quad Peripheral Interface ("QPI") and Double Transfer Rate ("DTR") read modes. In the QPI protocol, the complete interface (opcode, address, and data-out) is done on 4-bit basis. In the DTR protocol, the output data is provided on both low-going and high-going CLK edge, rather than providing output data only on low-going CLK edge as in Single Transfer Rate ("STR") read mode operation.

The cache program execute technique may include bad block management. The address of the page to be programmed is acquired and placed in the address register 626. The programming process continues by searching in the LUT register 627 to determine whether the address in the address register 626 matches any of the LBA's in the LUT register 627. This search may be performed quickly without significantly impacting programming time because the LUT register 627 may be a fast SRAM that is locally accessible by the control logic 630. If no match is found, the LBA is used to program a page of memory. If a match is found, a bad block is indicated and the PBA of the replacement block is used instead of the LBA in the address register 626 to program the desired page. Once the correct page address is obtained, the actual page programming process and the process of checking for a programming error may be performed in any desired manner. An example of a suitable technique is the conventional program-verify operation, which typically sets a pass/fail bit in the status register. After checking for a programming error, bad block management may be performed if desired. Bad block management may be performed in various ways, such as, for example, under user control by the host or controller, semi-automatically in response to bad block marking by the host or controller, automatically by the control logic of the NAND flash memory device, or in any other suitable manner.

Bad block management is particularly useful for maintaining programming throughput during sequential program operations, since the user may program across physical block boundaries without concern for bad blocks. The user may activate sequential program mode by setting Sequential Bit SEQ 654.

The description of the invention including its applications and advantages as set forth herein is illustrative and is not intended to limit the scope of the invention, which is set forth in the claims. Variations and modifications of the embodiments disclosed herein are possible, and practical alternatives to and equivalents of the various elements of the embodiments would be understood to those of ordinary skill in the art upon study of this patent document. For example, although many of the implementations described herein are for serial NAND memory, certain techniques described herein such as the power-up sequence, mode selection, and continuous data output across page boundaries and from logically contiguous memory locations without wait intervals, may be used for parallel NAND memory. Moreover, specific values given herein are illustrative and may be varied as desired, and terms such as "first" and "second" are distinguishing terms and are not to be construed to imply an order or a specific part of the whole. These and other variations and modifications of the embodiments disclosed herein, including of the alternatives and equivalents of the various elements of the embodiments, may be made without departing from the scope and spirit of the invention, including the invention as set forth in the following claims.

The invention claimed is:

1. A method of programming a NAND flash memory array of a memory device,
   wherein the memory device comprises:
      a NAND flash memory array;
      a row decoder coupled to the NAND flash memory array;
      a data register coupled to the NAND flash memory array;
      a cache register coupled to the data register;
      an error correction code ("ECC") circuit coupled to the cache register;
      a column decoder coupled to the cache register; and
      a control circuit coupled to the row decoder, the column decoder, the data register, the cache register, and the ECC circuit,
   the method comprising:
      storing in the cache register a first page of program data from a data bus;
      performing, by the ECC circuit coupled to the cache register, an error correction code ("ECC") operation on the first page of program data stored in the cache register to establish a first page of ECC processed data in the cache register;
      storing in the data register the first page of ECC processed data from the cache register;
      programming, by the row decoder and the column decoder, the NAND flash memory array with the first page of ECC processed data from the data register;
      storing in the cache register a second page of program data from the data bus, in an overlapping time relationship with the first page programming step while programming the NAND flash memory array with the first page of ECC processed data from the data register; and
      performing, by the ECC circuit coupled to the cache register, the error correction code ("ECC") operation on the second page of program data stored in the cache register to establish a second page of ECC processed data in the cache register, in an overlapping time relationship with the first page programming step while programming the NAND flash memory array with the first page of ECC processed data from the data register.

2. The method of claim 1, further comprising:
   storing in the data register the second page of ECC processed data from the cache register;
   programming the NAND flash memory array with the second page of ECC processed data from the data register;
   storing in the cache register a third page of program data from the data bus, in an overlapping time relationship with the second page programming step while programming the NAND flash memory array with the second page of ECC processed data from the data register; and
   performing the error correction code ("ECC") operation on the third page of program data stored in the cache register to establish a third page of ECC processed data in the cache register, in an overlapping time relationship with the second page programming step while programming the NAND flash memory array with the second page of ECC processed data from the data register.

3. The method of claim 1, wherein:
   the cache register comprises a plurality of separately-controllable portions;
   the first page error correction code ("ECC") operation performing step comprises performing the error correction code ("ECC") operation on portions of the first page of program data respectively stored in the portions of the cache register; and
   the second page error correction code ("ECC") operation performing step comprises performing the error correction code ("ECC") operation on portions of the second page of program data respectively stored in the portions of the cache register.

4. The method of claim 1, wherein:
   the cache register comprises a plurality of separately-controllable portions;
   the first page error correction code ("ECC") operation performing step comprises performing the error correction code ("ECC") operation on the first page of program data stored in the cache register, the separately-controllable portions of the cache register being controlled as a single page; and
   the second page error correction code ("ECC") operation performing step comprises performing the error correction code ("ECC") operation on the second page of program data stored in the cache register, the separately-controllable portions of the cache register being controlled as a single page.

5. The method of claim 1, wherein:
the cache register is controllable as a single page;
the first page error correction code ("ECC") operation performing step comprises performing the error correction code ("ECC") operation on the first page of program data stored in the cache register; and
the second page error correction code ("ECC") operation performing step comprises performing the error correction code ("ECC") operation on the second page of program data stored in the cache register.

6. The method of claim 1, further comprising, prior to the programming step:
acquiring an address of a page to be programmed;
searching a look-up table register in the memory device configured for maintaining mappings of logical block addresses to physical block addresses for bad blocks, to identify whether the address of the page to be programmed matches any logical block addresses in the look-up table register; and
establishing a programming address using the address of the page to be programmed when the searching step fails to identify a match of the address of the page to be programmed with a logical block address, and when the searching step identifies a logical block address matching the address of the page to be programmed, using a physical address corresponding to the matching logical block address in the look-up table;
wherein the programming step comprises programming the NAND flash memory array with the first page of ECC processed data from the data register using the programming address.

7. A memory device comprising:
a NAND flash memory array;
a row decoder coupled to the NAND flash memory array;
a data register coupled to the NAND flash memory array;
a cache register coupled to the data register;
an ECC circuit coupled to the cache register;
a column decoder coupled to the cache register; and
a control circuit coupled to the row decoder, the column decoder, the data register, the cache register, and the ECC circuit, wherein the control circuit comprises logic and register elements for executing the functions of:
storing in the cache register a first page of program data;
performing an error correction code ("ECC") operation on the first page of program data stored in the cache register with the ECC circuit, to establish a first page of ECC processed data in the cache register;
storing in the data register the first page of ECC processed data from the cache register;
programming the NAND flash memory array with the first page of ECC processed data from the data register;
storing in the cache register a second page of program data, in an overlapping time relationship with the programming of the NAND memory while programming the NAND flash memory array with the first page of ECC processed data from the data register; and
performing the error correction code ("ECC") operation on the second page of program data stored in the cache register to establish a second page of ECC processed data in the cache register, in an overlapping time relationship with the programming of the NAND flash memory array while programming the NAND flash memory array with the first page of ECC processed data from the data register.

8. The memory device of claim 7, wherein the control circuit further comprises logic and register elements for executing the functions of:
storing in the data register the second page of ECC processed data from the cache register;
programming the NAND flash memory array with the second page of ECC processed data from the data register;
storing in the cache register a third page of program data from the data bus, in an overlapping time relationship with the second page programming step while programming the NAND flash memory array with the second page of ECC processed data from the data register; and
performing the error correction code ("ECC") operation on the third page of program data stored in the cache register to establish a third page of ECC processed data in the cache register, in an overlapping time relationship with the second page programming step while programming the NAND flash memory array with the second page of ECC processed data from the data register.

9. The memory device of claim 7 wherein the cache register comprises a plurality of separately-controllable portions.

10. The memory device of claim 7 wherein the cache register is controllable as a single page.

11. The memory device of claim 7 further comprising a look-up table register configured for maintaining mappings of logical block addresses to physical block addresses for bad blocks, wherein the control circuit further comprises logic and register elements for executing the functions of:
acquiring an address of a page to be programmed;
searching the look-up table register to identify whether the address of the page to be programmed matches any logical block addresses in the look-up table register; and
establishing a programming address using the address of the page to be programmed when the searching function fails to identify a match of the address of the page to be programmed with a logical block address, and when the searching function identifies a logical block address matching the address of the page to be programmed, using a physical address corresponding to the matching logical block address in the look-up table;
and wherein the programming function comprises programming the NAND flash memory array with the first page of ECC processed data from the data register using the programming address.

* * * * *